US008586441B1

(12) United States Patent
Cai et al.

(10) Patent No.: US 8,586,441 B1
(45) Date of Patent: *Nov. 19, 2013

(54) GERMANIUM LATERAL BIPOLAR JUNCTION TRANSISTOR

(75) Inventors: Jin Cai, Cortlandt Manor, NY (US); Kevin K. Chan, Staten Island, NY (US); Christopher P. D'Emic, Ossining, NY (US); Bahman Hekmatshoartabari, White Plains, NY (US); Tak H. Ning, Yorktown Heights, NY (US); Dae-Gyu Park, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/611,606

(22) Filed: Sep. 12, 2012

Related U.S. Application Data

(63) Continuation of application No. 13/607,672, filed on Sep. 8, 2012.

(51) Int. Cl.
*H01L 21/331* (2006.01)

(52) U.S. Cl.
USPC ..... 438/311; 438/312; 438/316; 257/E21.372

(58) Field of Classification Search
USPC .......................................... 438/311, 312, 316
See application file for complete search history.

(56) References Cited

U.S. PATENT DOCUMENTS

| 5,105,250 | A | 4/1992 | Tam et al. |
| 5,422,502 | A | 6/1995 | Kovacic |
| 5,734,183 | A | 3/1998 | Morishita |
| 7,132,372 | B2 | 11/2006 | Smith et al. |
| 7,214,593 | B2 | 5/2007 | Coolbaugh et al. |
| 7,960,645 | B2 | 6/2011 | Posthuma et al. |
| 8,012,592 | B2 | 9/2011 | Fitzgerald |

(Continued)

FOREIGN PATENT DOCUMENTS

| JP | 2004111575 A | 4/2004 |
| WO | 03096390 A1 | 11/2003 |

OTHER PUBLICATIONS

Ghosh, S. et al., "Integration of Demand Response and Renewable Resources for Power Generation Management" IEEE PES Innovative Smart Grid Technologies (Jan. 17-19, 2011) pp. 1-7.

(Continued)

*Primary Examiner* — Alexander Ghyka
(74) *Attorney, Agent, or Firm* — Scully, Scott, Murphy & Presser, P.C.; Louis J. Percello, Esq.

(57) ABSTRACT

A germanium lateral bipolar junction transistor (BJT) is formed employing a germanium-on-insulator (GOI) substrate. A silicon passivation layer is deposited on the top surface of a germanium layer in the GOI substrate. Shallow trench isolation structures, an extrinsic base region structure, and a base spacer are subsequently formed. A germanium emitter region, a germanium base region, and a germanium collector region are formed within the germanium layer by ion implantation. A silicon emitter region, a silicon base region, and a silicon collector region are formed in the silicon passivation layer. After optional formation of an emitter contact region and a collector contact region, metal semiconductor alloy regions can be formed. A wide gap contact for minority carriers is provided between the silicon base region and the germanium base region and between the silicon emitter region and the germanium emitter region.

20 Claims, 8 Drawing Sheets

(56) References Cited

U.S. PATENT DOCUMENTS

| | | | |
|---|---|---|---|
| 2003/0071278 | A1 | 4/2003 | Lippert et al. |
| 2006/0157823 | A1 | 7/2006 | Sheridan et al. |
| 2006/0220064 | A1 | 10/2006 | Joodaki et al. |
| 2007/0045664 | A1 | 3/2007 | Miura et al. |
| 2007/0105330 | A1 | 5/2007 | Enicks et al. |
| 2011/0230031 | A1 | 9/2011 | Griglione |
| 2011/0316051 | A1 | 12/2011 | Takada et al. |
| 2012/0139009 | A1 | 6/2012 | Ning et al. |
| 2013/0161706 | A1* | 6/2013 | Ning et al. .................... 257/280 |

OTHER PUBLICATIONS

Schellenberg, A. et al., "Cumulant Based Stochastic Optimal Power Flow (S-OPF) for Variance Optimization" IEEE Power Engineering Society General Meeting (Jun. 12-16, 2005) pp. 1-6, vol. 1.

Wu, J. et al., "Economic Dispatch Including Wind Power Injection" Proceedings of ISES Solar World Congress 2007: Solar Energy and Human Settlement (2009) pp. 2343-2347, vol. I-V.

Yong, T. et al., "Reserve Determination for System with Large Wind Generation" IEEE Power & Energy Society General Meeting (Jul. 26-30, 2009) pp. 1-7.

U.S. Appl. No. 13/048,366, filed Mar. 15, 2011, Entitled: Vertical Polysilicon-Germanium Heterojunction Bipolar Transistor, First Named Inventor: Jin Cai.

U.S. Appl. No. 13/048,342, filed Mar. 15, 2011, Entitled: Horizontal Polysilicon-Germanium Heterojunction Bipolar Transistor, First Named Inventor: Jin Cai.

U.S. Appl. No. 13/433,537, filed Mar. 29, 2012, Entitled: SOI Lateral Bipolar Junction Transistor Having a Wide Band Gap Emitter Contact, First Named Inventor: Jin Cai.

U.S. Appl. No. 13/158,419, filed Jun. 12, 2011, Entitled: Complementary Bipolar Inverter, First Named Inventor: Jin Cai.

Notice of Allowance, dated Jun. 4, 2013, received in a related U.S. Appl. No. 13/607,672.

\* cited by examiner

US 8,586,441 B1

GERMANIUM LATERAL BIPOLAR JUNCTION TRANSISTOR

CROSS REFERENCE TO RELATED APPLICATION

This application is a continuation of U.S. patent application Ser. No. 13/607,672, filed Sep. 8, 2012 the entire content and disclosure of which is incorporated herein by reference.

BACKGROUND

The present disclosure relates to a lateral bipolar junction transistor (BJT) structure, and particularly to a germanium lateral bipolar junction transistor and methods of manufacturing the same.

Germanium has a narrower band gap than silicon, and provides a great potential for providing a fast bipolar junction transistor that operates at low voltages. A silicon BJT typically operates at about 1 V while a germanium BJT typically operates at about 0.6 V. However, manufacture of a germanium-based device has been a challenge because germanium oxide is soluble in water. Thus, the advantageous properties of germanium derived from the narrower band gap has been only partly utilized through use of a silicon-germanium alloy, which has a band gap that is narrower than the band gap of silicon, and is wider than the band gap of germanium.

SUMMARY

A germanium lateral bipolar transistor is formed employing a germanium-on-insulator (GOI) substrate. A silicon passivation layer is deposited on the top surface of a germanium layer in the GOI substrate. Shallow trench isolation structures, an extrinsic base region structure, and a base spacer are subsequently formed. A germanium emitter region, a germanium base region, and a germanium collector region are formed within the germanium layer by ion implantation. A silicon emitter region, a silicon base region, and a silicon collector region are formed in the silicon passivation layer. After optional formation of an emitter contact region and a collector contact region, metal semiconductor alloy regions can be formed. A wide gap base contact for minority carriers is provided between the silicon base region and the germanium base region, resulting in reduced minority carriers injection into the base contact, and a wide gap emitter contact for minority carriers is provided between the silicon emitter region and the germanium emitter region, resulting in reduced minority carriers injection into the emitter contact, so as to provide a greater amplification ratio between the base current and the emitter current.

According to an aspect of the present disclosure, a semiconductor structure including a bipolar junction transistor (BJT) is provided. The BJT comprises a doped germanium layer in contact with an insulator layer and including a germanium base region including dopants of a first conductivity type, a germanium emitter region in contact with the germanium base region and including dopants of a second conductivity type that is the opposite type of the first conductivity type, and a germanium collector region in contact with the germanium base region and including dopants of the second conductivity type. The BJT further comprises a silicon passivation layer in contact with the doped germanium layer and including a silicon base region, a silicon emitter region in contact with the silicon base region, and a silicon collector region in contact with the silicon base region. The silicon base region includes dopants of the first conductivity type and contacts the germanium base region, the silicon emitter region includes dopants of the second conductivity type and contacts the germanium emitter region, and the silicon collector region includes dopants of the second conductivity type and contacts the germanium collector region. In addition, the BJT includes an extrinsic base region in contact with the silicon base region.

According to another aspect of the present disclosure, a method of forming a semiconductor structure including a bipolar junction transistor (BJT) is provided. A substrate is provided, which includes a vertical stack of an insulator layer and a germanium layer having a doping of a first conductivity type. A silicon passivation layer is formed on the germanium layer. An extrinsic base region is formed on the silicon passivation layer. Regions having a doping of a second conductivity type that is the opposite of the first conductivity type are formed in the germanium layer and in the silicon passivation layer by ion implantation of dopants of the second conductivity type. A germanium emitter region and a germanium collector region are formed in the germanium layer, and a silicon emitter region and a silicon collector region are formed in the silicon passivation layer.

DETAILED DESCRIPTION

Figure 1:
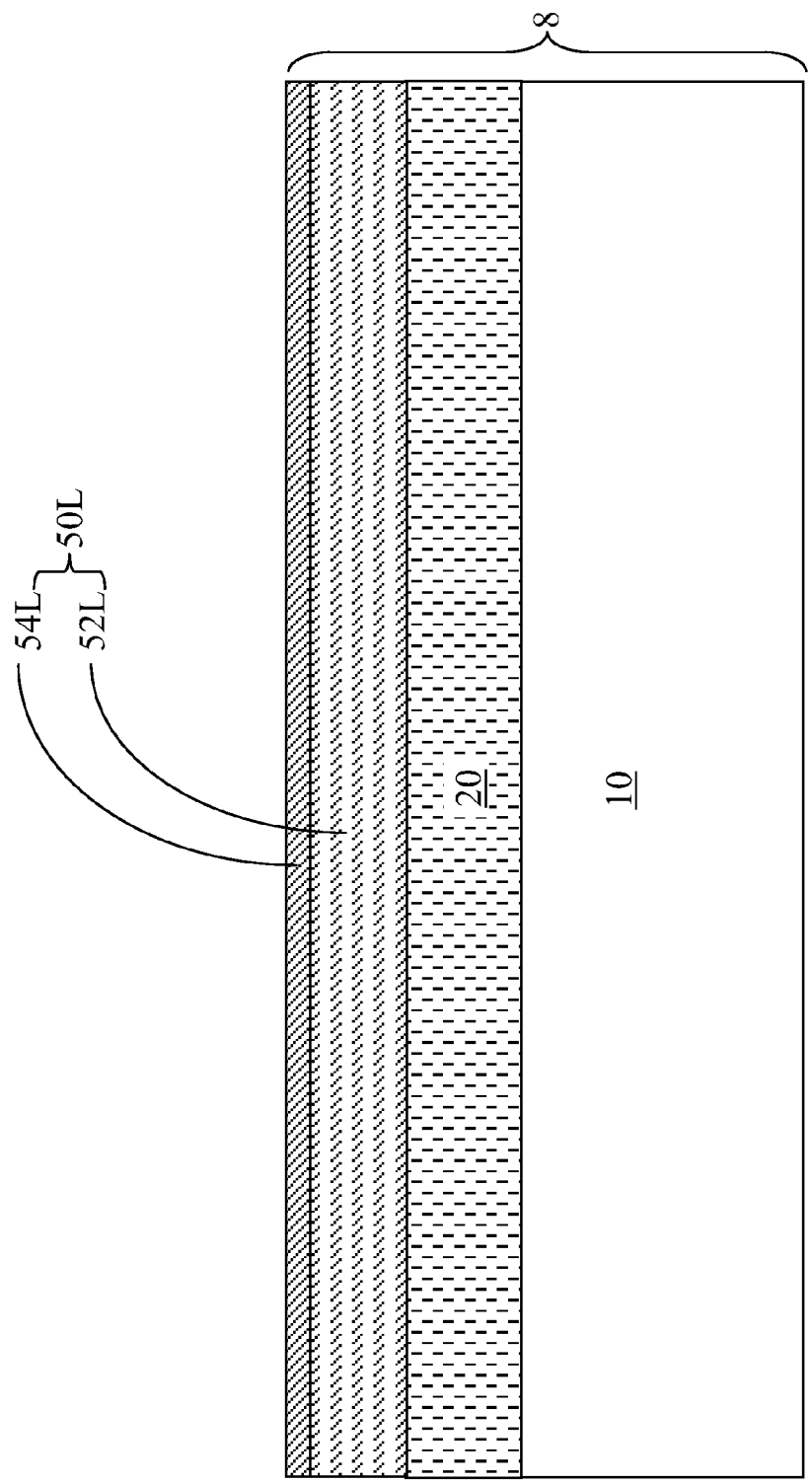
FIG. 1 is a vertical cross-sectional view of an exemplary semiconductor structure after providing a germanium-on-insulator (GOI) substrate and formation of a silicon passivation layer thereupon according to an embodiment of the present disclosure.

As stated above, the present disclosure relates to a germanium lateral bipolar junction transistor and methods of manufacturing the same, which are now described in detail with accompanying figures. It is noted that like and corresponding elements mentioned herein and illustrated in the drawings are referred to by like reference numerals.

Referring to FIG. 1, an exemplary semiconductor structure according to an embodiment of the present disclosure can be formed by providing a germanium-on-insulator (GOI) substrate. The GOI substrate can include a stack, from bottom to top, of a handle substrate 10, a buried insulator layer 20 contacting a top surface of the handle substrate 10, and a germanium layer 52L contacting the top surface of the buried insulator layer 20. The germanium layer 52L as provided can include a single crystalline germanium material that extends across the entirety of the buried insulator layer 20.

The handle substrate 10 can include a semiconductor material, an insulator material, a conductor material, or a combination thereof. In one example, the handle substrate 10 can include a semiconductor material such as silicon. If the handle substrate 10 includes a semiconductor material, the handle substrate 10 can be undoped or have a p-type doping or an n-type doping.

The buried insulator layer 20 includes a dielectric material such as silicon oxide and/or silicon nitride. For example, the buried insulator layer 20 can include thermal silicon oxide. The thickness of the buried insulator layer 20 can be from 5 nm to 1000 nm, and typically from 100 nm to 200 nm, although lesser and greater thicknesses can also be employed. The buried insulator layer 20 may, or may not, include multiple dielectric layers, e.g., a stack including at least a silicon oxide layer and a silicon nitride layer.

In one embodiment, the top surface of the buried insulator layer 20 can include a silicon nitride layer or a silicon oxynitride layer in order to prevent oxidation of the bottom portion of the germanium layer 52L. The handle substrate 10 in the GOI substrate (10, 20, 52L) contacts a planar bottom surface of the buried insulator layer 20.

The germanium layer 52L as provided in the GOI substrate can be a planar semiconductor material layer having a first thickness. The first thickness can be, for example, from 5 nm to 1,000 nm, although lesser and greater thicknesses can also be employed. The germanium layer 52L is a single crystalline germanium layer. The germanium layer 52L can be doped with electrical dopants, which can be p-type dopants or n-type dopants. The type of dopants in the germanium layer 52L is herein referred to as a first conductivity type. The germanium layer 52L can consist essentially of germanium and the dopants of the first conductivity type.

If the first conductivity type is p-type, the electrical dopants in the germanium layer 52L can be, for example, B, Al, Ga, In, and/or Tl. If the first conductivity type is n-type, the electrical dopants can be, for example, P, As, and/or Sb. The dopant concentration in the germanium layer 52L can be from $1.0 \times 10^{15}/cm^3$ to $3.0 \times 10^{19}/cm^3$, although lesser and greater dopant concentrations can also be employed.

A silicon passivation layer 54L is formed upon the germanium layer 52L. The silicon passivation layer 54L includes silicon and optionally dopants of the first conductivity type. The silicon passivation layer 54L can be formed as a polycrystalline layer or an amorphous layer. As used herein, a "polycrystalline" layer refers to a layer having any type of polycrystalline structure including microcrystalline and nanocrystalline structures. In one embodiment, the silicon passivation layer 54L can be formed as a polycrystalline layer. In another embodiment, the silicon passivation layer 54L can be formed as an amorphous layer and then annealed to be converted into a polycrystalline layer. In yet another embodiment, silicon passivation layer 54L can be formed as an amorphous layer and conversion into a polycrystalline layer may be postponed until after a subsequent processing step such as formation of an extrinsic base region, formation of a dielectric spacer, implantation of dopants to form emitter and collector regions, or formation of emitter contact regions and collector contact regions.

The silicon passivation layer 54L passivates the surface of the germanium layer 52L, thereby preventing oxidation of the germanium layer 52L. The silicon passivation layer 54L can be formed by chemical vapor deposition (CVD), vacuum evaporation, molecular beam deposition, atomic layer deposition (ALD), and/or physical vapor deposition (PVD). The silicon passivation layer 54L conformally covers the entirety of the top surface of the germanium layer 52L. The thickness of the silicon passivation layer 54L is selected so as to enable complete coverage of the surface of the germanium layer 52L. Due to the lattice mismatch between the germanium lattice constant and the silicon lattice constant, the silicon passivation layer 54L cannot be deposited with epitaxial alignment to the germanium layer 52L, and is deposited in Stranski-Krastanov growth mode. Thus, the thickness of the silicon passivation layer 54L is herein referred to as a second thickness, and is greater than 1 monolayer of silicon. In one embodiment, the second thickness of the silicon passivation layer 54L can be from 2 nm to 50 nm, although lesser and greater thicknesses can also be employed. The first thickness can be at least twice the second thickness.

The silicon passivation layer 54L can be in-situ doped or ex-situ doped (for example, by ion implantation after deposition of an intrinsic silicon material) with dopants of the first conductivity type. The concentration of the first conductivity type dopants in the silicon passivation layer 54L can be comparable to the concentration of the first conductivity type dopants in the germanium layer 52L. Alternately, the silicon passivation layer 54L can be deposited as an intrinsic layer, which can be subsequently doped during a thermal anneal to be doped with some of the dopants of the first conductivity type in the germanium layer 20. The vertical stack of the germanium layer and the silicon passivation layer 54L is herein referred to a semiconductor layer stack 50L. Upon formation of the silicon passivation layer 54L, the GOI substrate 8 includes a stack, from bottom to top, of the handle substrate 10, the buried insulator layer 20, and the semiconductor layer stack 50L.

Figure 2:
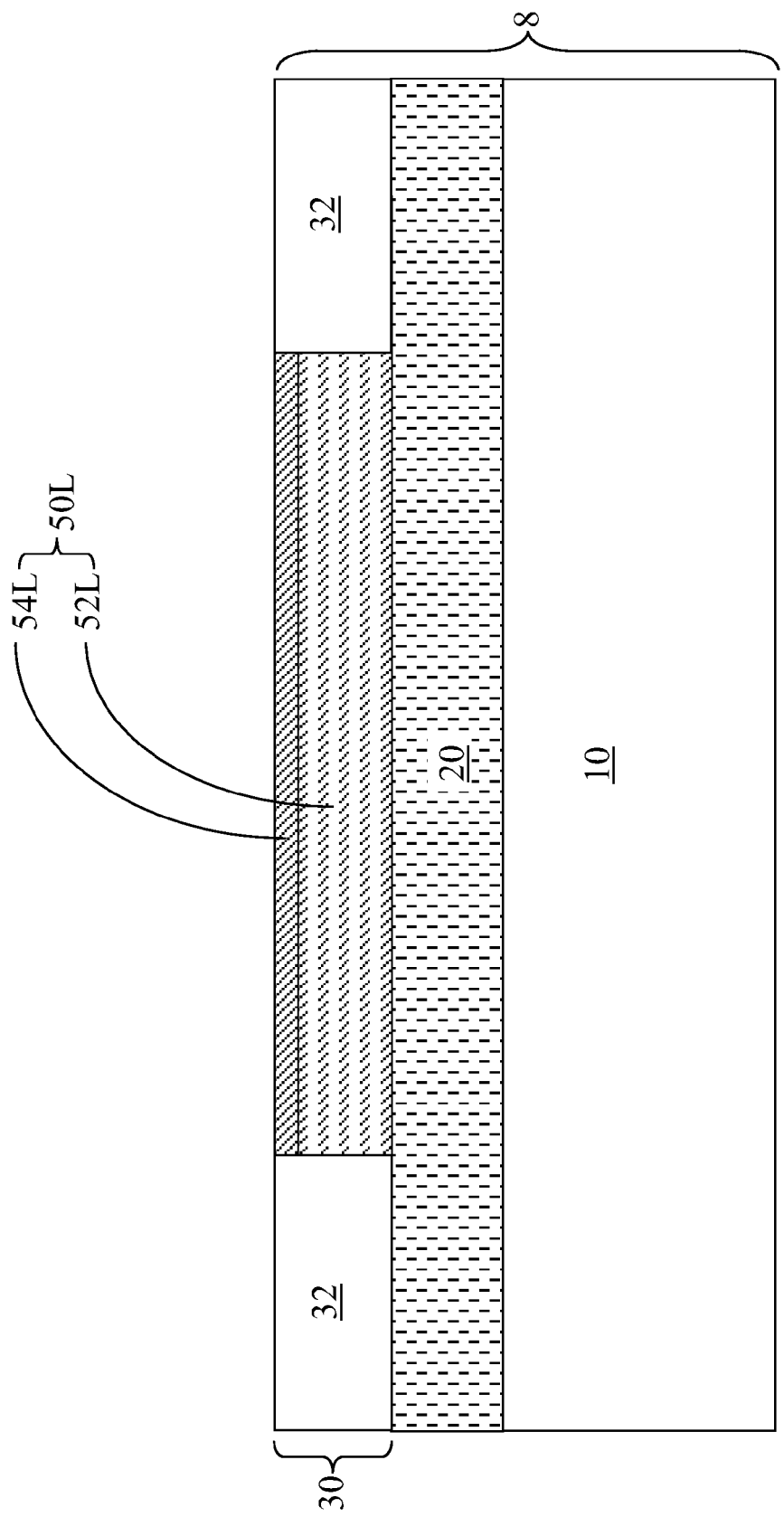
FIG. 2 is a vertical cross-sectional view of the exemplary semiconductor structure after formation of a shallow trench isolation structure according to an embodiment of the present disclosure.

Referring to FIG. 2, at least one shallow trench extending at least to the top surface of the buried insulator layer 20 is formed through the semiconductor layer stack 50L, and is subsequently filled with a dielectric material such as silicon oxide, silicon nitride, and/or silicon oxynitride. The at least one shallow trench can be formed to laterally enclose an unetched region of the semiconductor layer stack 50L. The dielectric material can be deposited, for example, by chemical vapor deposition (CVD).

Excess portions of the dielectric material is removed from above the top surface of the top semiconductor portion, for example, by a recess etch or chemical mechanical planarization (CMP). A remaining portion of the dielectric material that fills the at least one shallow trench constitutes at least one shallow trench isolation structure 32. One of the at least one shallow trench isolation structure laterally encloses, and contacts all sidewalls of, a remaining portion of the semiconductor layer stack 50L, i.e., a remaining portion of the vertical stack of the germanium layer 52L and the silicon passivation layer 54L. The top surface of the shallow trench isolation structure 32 can be coplanar with, raised above, or recessed below, the top surface of the semiconductor layer stack 50L.

Figure 3:
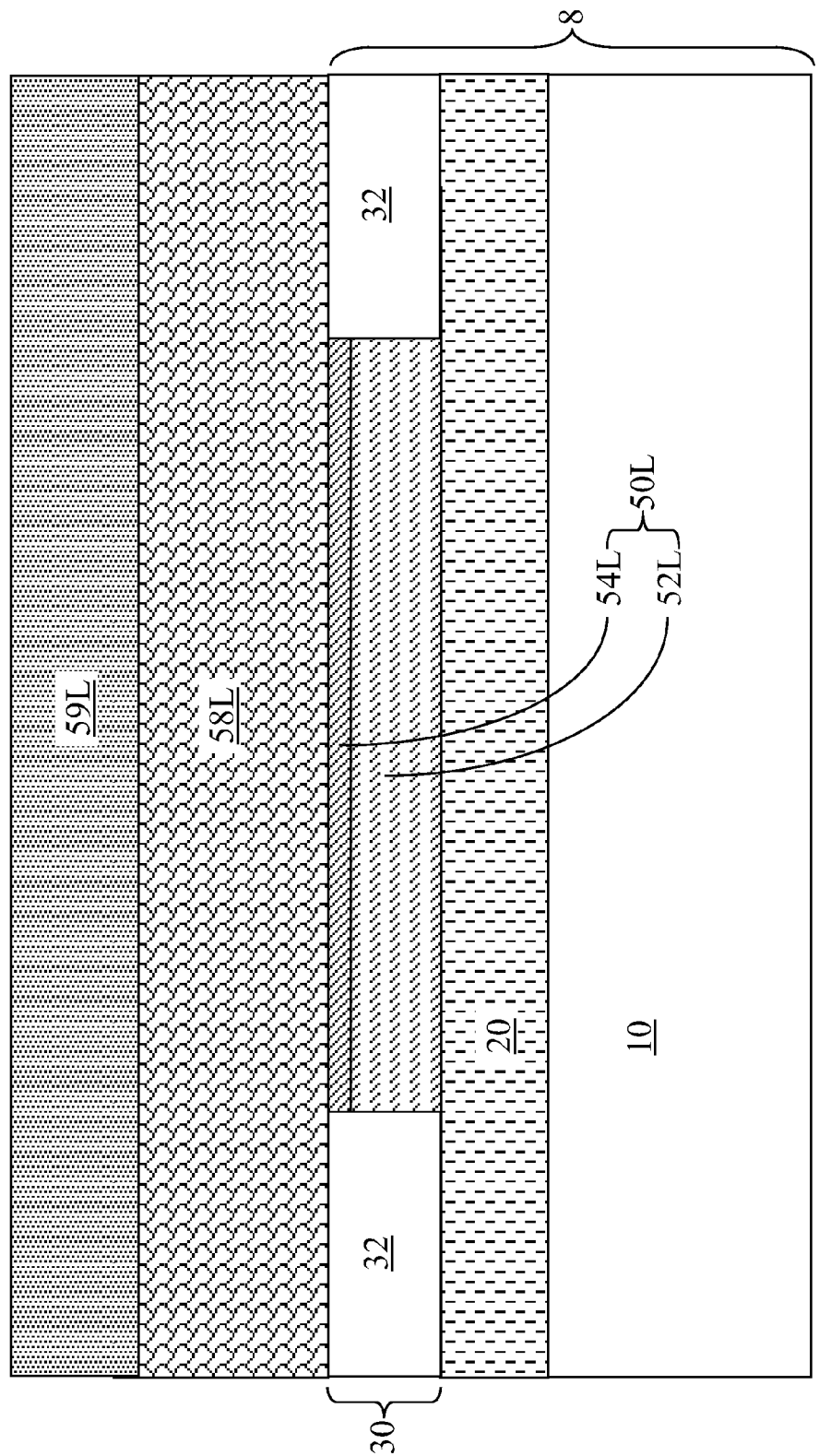
FIG. 3 is a vertical cross-sectional view of the exemplary semiconductor structure after formation of an extrinsic base layer and a base cap layer according to an embodiment of the present disclosure.

Referring to FIG. 3, an extrinsic base layer 58L and a base cap layer 59L are sequentially deposited over semiconductor layer stack 50L. The extrinsic base layer 58L can be a doped semiconductor material layer having a doping of the first conductivity type. The doped semiconductor material of the extrinsic base layer 58L is herein referred to as an extrinsic base region semiconductor material. In one embodiment, the extrinsic base layer 58L includes a different semiconductor material than the silicon passivation layer 54L. In another embodiment, the extrinsic base layer 58L includes a same semiconductor material as the silicon passivation layer 54L. In one embodiment, the extrinsic base layer 58L can be polycrystalline or amorphous as deposited. The extrinsic base layer 58L is polycrystalline as deposited, or is amorphous as deposited and is converted into a polycrystalline material in a subsequent thermal processing step (such as an activation anneal after formation of emitter regions and collector regions).

The extrinsic base layer 58L has a doping of the first conductivity type. The extrinsic base layer 58L can be in-situ doped during deposition, or can be deposited as an intrinsic semiconductor material layer and subsequently doped by ion implantation, gas phase doping, plasma doping, or diffusion of electrical dopants from a disposable dopant source layer (such as a phosphosilicate glass layer, a borosilicate glass layer, or an arsenosilicate glass layer). For example, the extrinsic base layer 58L includes dopants of the first conductivity type at a dopant concentration from $1.0\times10^{18}/cm^3$ to $3.0\times10^{21}/cm^3$, although lesser and greater dopant concentrations can also be employed. In one embodiment, the extrinsic base layer 58L can include a doped polycrystalline material having a doping of the first conductivity type. The extrinsic base layer 58L can be deposited, for example, by chemical vapor deposition (CVD) or physical vapor deposition (PVD). The thickness of the extrinsic base layer 58L can be from 10 nm to 1,000 nm, although lesser and greater thicknesses can also be employed.

The base cap layer 59L includes a dielectric material such as silicon oxide, silicon nitride, silicon oxynitride, a dielectric metal oxide, or a combination thereof. The base cap layer 59L can be deposited, for example, by chemical vapor deposition (CVD). The thickness of the base cap layer 59L can be from 10 nm to 1,000 nm, although lesser and greater thicknesses can also be employed. In one embodiment, the thickness of the base cap layer 59L can be selected to have the same stopping power as, or a greater stopping power than, the semiconductor layer stack 50L for ion implantation, to be subsequently performed, of dopants of a second conductivity type that is the opposite of the first conductivity type. In one embodiment, a dielectric material different from the dielectric materials of the shallow trench isolation structure 32 is employed for the base cap layer 59L so that the material of the base cap layer 59L can be subsequently removed selective to the material of the shallow trench isolation structure.

Figure 4:
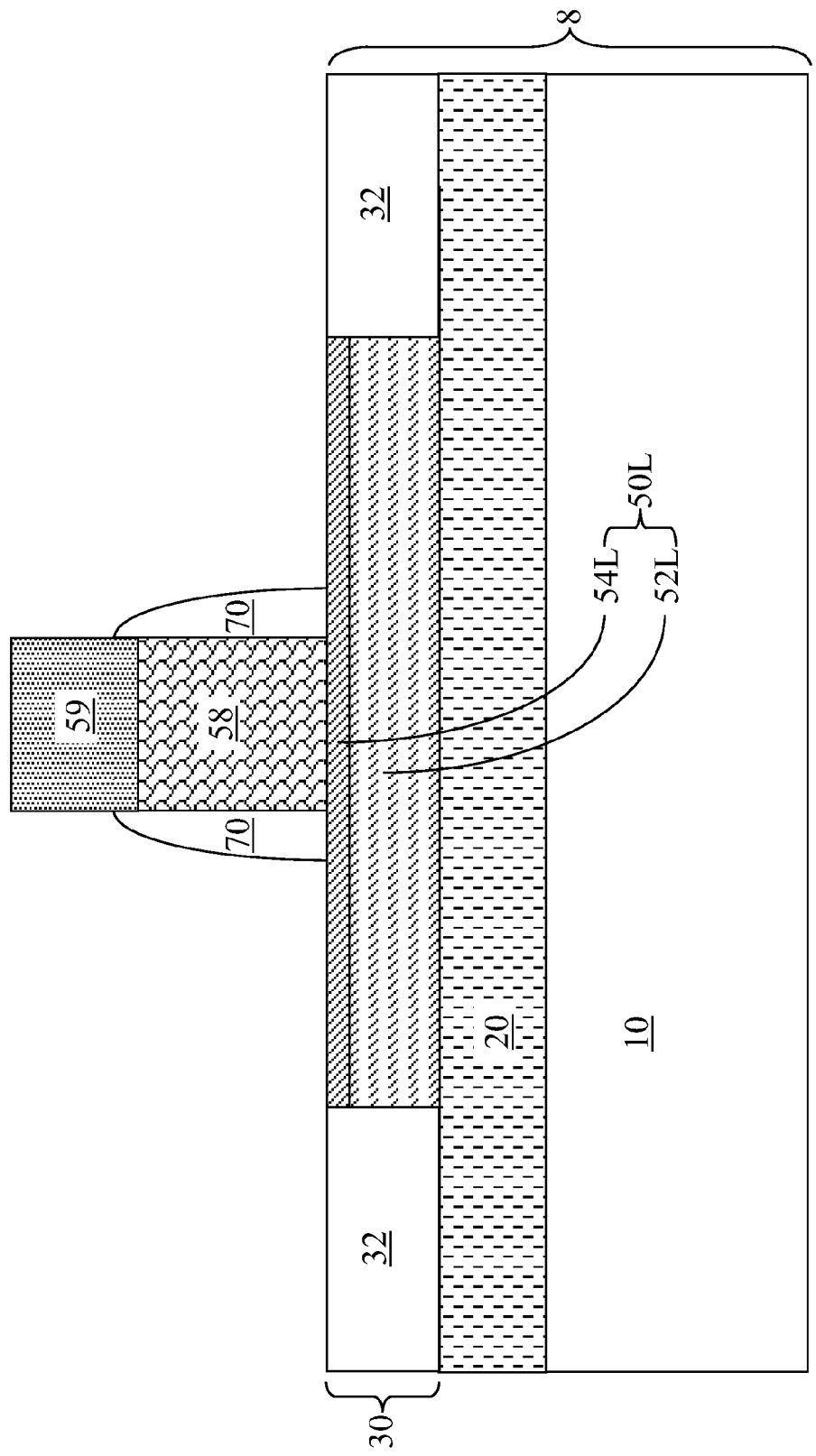
FIG. 4 is a vertical cross-sectional view of the exemplary semiconductor structure after formation of an extrinsic base region and a dielectric spacer according to an embodiment of the present disclosure.

Referring to FIG. 4, the stack of the base cap layer 59L and the extrinsic base layer 58L is patterned, for example, by applying and lithographically patterning a photoresist layer (not shown) and transferring the pattern in the patterned photoresist layer through the stack of the base cap layer 59L and the extrinsic base layer 58L. A remaining portion of the base cap layer 59L is herein referred to as a base cap 59, and a remaining portion of the extrinsic base layer 58L is herein referred to as an extrinsic base region 58. The transfer of the pattern from the patterned photoresist layer to the stack of the base cap layer 59L and the extrinsic base layer 58L can be effected by an anisotropic etch. In this case, the sidewalls of the extrinsic base region 58 can be substantially vertically coincident with sidewalls of the base cap 59. As used herein, a first surface is vertically coincident with a second surface if the first and second surfaces are within a same two-dimensional vertical plane. As used herein, a first surface is substantially vertically coincident with a second surface if a first two-dimensional vertical plane including the first surface and a second two-dimensional vertical plane including the second surface are either vertically coincident, or parallel to each other and laterally separated from each other by no more than the sum of the root-mean-square surface roughness of the first surface and the root-mean-square surface roughness of the second surface.

The horizontal cross-sectional shape of the base cap 59 and the extrinsic base region 58 is selected such that the stack of the extrinsic base region 58 and the base cap 59 straddles over a middle portion of the semiconductor layer stack 50L that is laterally surrounded by the shallow trench isolation structure 32. The stack of the extrinsic base region 58 and the base cap 59 can extend across the semiconductor layer stack 50L, and two end portions of the stack of the extrinsic base region 58 and the base cap 59 can overlie the shallow trench isolation structure 32. Thus, the top surface of a first peripheral portion of the silicon passivation layer 54L is physically exposed on one side of the stack of the extrinsic base region 58 and the base cap 59, and the top surface of a second peripheral portion of the silicon passivation layer 54L is physically exposed on another side of the stack of the extrinsic base region 58 and the base cap 59 after formation of the stack of the extrinsic base region 58 and the base cap 59.

The endpointing of the anisotropic etch that forms the stack of the extrinsic base region 58 and the base cap 59 can be effected by detecting physical exposure of the top surface of the shallow trench isolation structure 32 through optical means or through detection of change of radical composition in the plasma of the anisotropic etch. Alternately or additionally, if the extrinsic base region semiconductor material is different from silicon, the endpointing of the anisotropic etch can be effected by detecting physical exposure of the top surface of the silicon passivation layer 54L through optical means or through detection of change of radical composition in the plasma of the anisotropic etch. Yet alternately or additionally, if there exists an interfacial layer such as a native oxide layer (having a thickness on the order of one atomic layer of a semiconductor oxide) at the interface between the silicon passivation layer 54L and the extrinsic base layer 58L, an etch chemistry that is highly selective to a semiconductor oxide can be employed to minimize an overetch into the silicon passivation layer 54L.

In one embodiment, physically exposed surfaces of the silicon passivation layer 54L after the anisotropic etch can be coplanar with the interface between the silicon passivation layer 54L and the extrinsic base region 58. In another embodiment, physically exposed surfaces of the silicon passivation layer 54L after the anisotropic etch can be recessed relative to the interface between the silicon passivation layer 54L and the extrinsic base region 58. While the present disclosure is described employing an anisotropic etch, embodiment in which an isotropic etch such as a wet etch is employed to transfer the pattern in the patterned photoresist layer through the stack of the extrinsic base region 58 and the base cap 59 are also contemplated. Use of an isotropic etch may be suitable if the lateral dimension of the extrinsic base region 58 is not critical for the purposes of application of a bipolar junction transistor to be formed. The patterned photoresist layer can be subsequently removed, for example, by ashing. The extrinsic base region 58 includes the extrinsic base region semiconductor material, has a doping of the first conductivity type, and provides an electrical contact to the portion of the silicon passivation layer 54L that is in contact with the extrinsic base region 58.

A dielectric spacer 70 can be formed on sidewalls of the extrinsic base region 58 and on portions of the top surface of the silicon passivation layer 54L that are proximal to the sidewalls of the extrinsic base region 58. The dielectric spacer 70 includes a dielectric material such as silicon oxide, silicon nitride, silicon oxynitride, organosilicate glass, or any dielectric material that can be employed to form a spacer as known in the art. In one embodiment, the material of the dielectric spacer 70 is selected to be different from the dielectric material of the base cap 59 so that the material of the base cap 59 can be subsequently removed selective to the material of the dielectric spacer 70.

The dielectric spacer 70 can be formed, for example, by conformal deposition of a dielectric material layer and subsequent anisotropic etch that removes the horizontal portions of the deposited dielectric material layer. The dielectric material layer can be deposited on sidewalls of the extrinsic base region 58 and on physically exposed top surfaces of the silicon passivation layer 54L. The conformal deposition of the dielectric material layer can be performed, for example, by chemical vapor deposition (CVD), atomic layer deposition (ALD), or a combination thereof. The horizontal portions of the dielectric material layer can be removed by an anisotropic etch. A remaining portion of the dielectric material layer is the dielectric spacer 70. The thickness of the dielectric spacer 70, as measured at the base that contact the silicon passivation layer 54L, can be from 10 nm to 300 nm, although lesser and greater thicknesses can also be employed. The dielectric spacer 70 is of unitary construction (in a single piece), and laterally contacts the sidewalls of the extrinsic base region 58 and the base cap 59.

Figure 5:
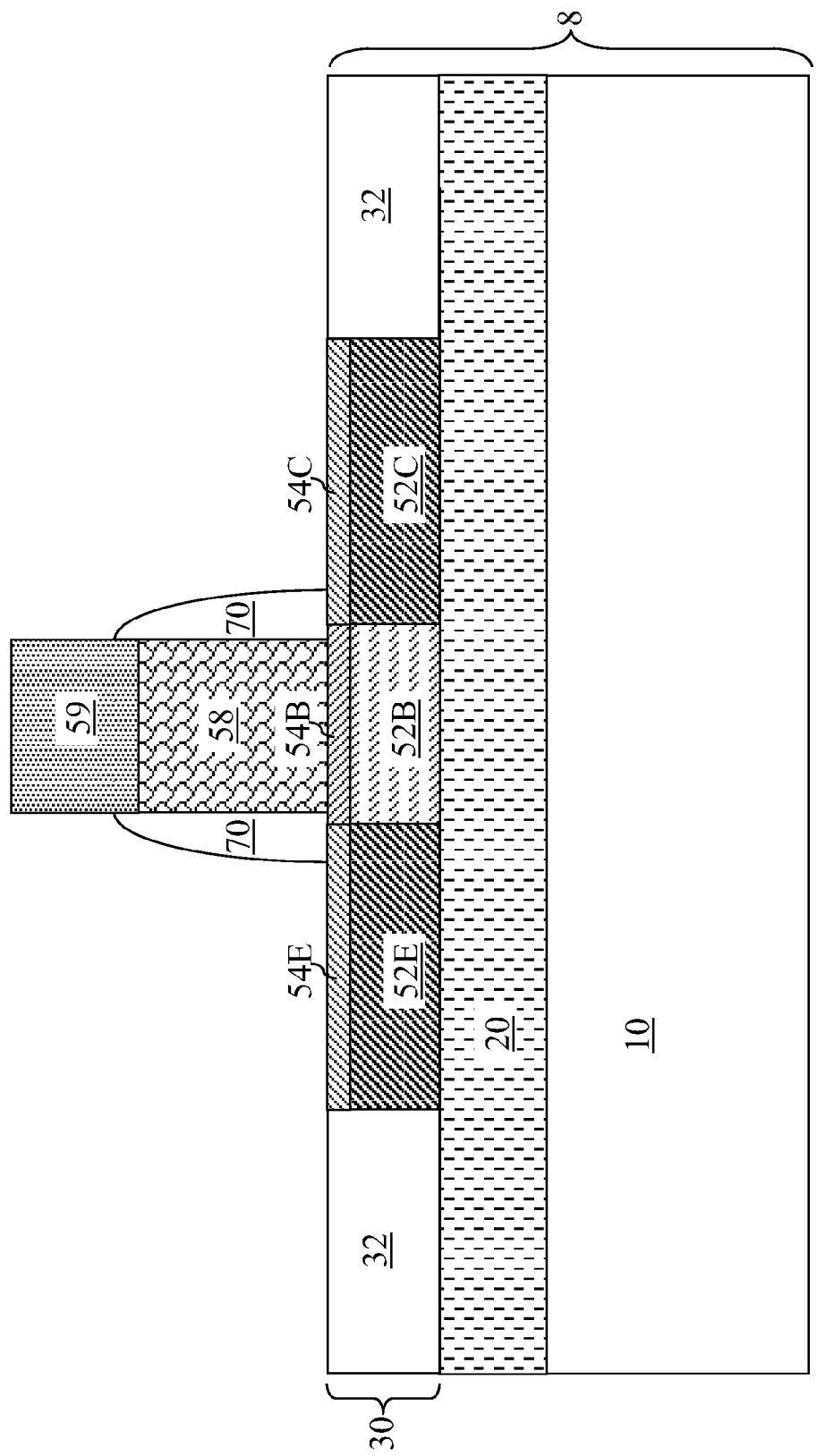
FIG. 5 is a vertical cross-sectional view of the exemplary semiconductor structure after an ion implantation that forms a germanium emitter region, a silicon emitter region, a germanium collector region, and a silicon collector region according to an embodiment of the present disclosure.

Referring to FIG. 5, regions having a doping of a second conductivity type are formed in the germanium layer 52L and in the silicon passivation layer 54L, for example, by ion implantation of dopants of the second conductivity type. Specifically, dopants of the second conductivity type are introduced into regions of the silicon passivation layer 54L and the germanium layer 52L that are not covered by the dielectric spacer 70 and the stack of the extrinsic base region 58 and the base cap 59. The second conductivity type is the opposite of the first conductivity type. If the first conductivity type is p-type, the second conductivity type is n-type, and vice versa. The dopants of the second conductivity type can be introduced, for example, by ion implantation employing the combination of the dielectric spacer 70 and the stack of the extrinsic base region 58 and the base cap 59 as an implantation mask. An additional implantation mask (not shown) such as a patterned photoresist layer can also be employed if multiple devices (not shown) are present on the substrate 8.

A germanium emitter region 52E and a germanium collector region 52C are formed in the implanted regions of the germanium layer 52L, and a silicon emitter region 54E and a silicon collector region 54C are formed in the implanted regions of the silicon passivation layer 54L. Specifically, introduction of dopants of the second conductivity type converts a first region of the germanium layer 52L into a germanium emitter region 52E and a second region of the germanium layer 52L into a germanium collector layer 52C. Further, introduction of dopants of the second conductivity type converts a first region of the silicon passivation layer 54L into a silicon emitter region 54E and a second region of the silicon passivation layer into a silicon collector region 54C.

A remaining region of the germanium layer 52L that is not implanted with dopants of the second conductivity constitutes a germanium base region 52B that laterally contacts the germanium emitter region 52E and the germanium collector region 52C. A remaining region of the silicon passivation layer 54L that is not implanted with dopants of the second conductivity type constitutes a silicon base region 54B that laterally contacts the silicon emitter region 54E and the silicon collector region 54C and vertically contacts the germanium base region 52B and the extrinsic base region 58. The germanium emitter region 52E, the germanium collector layer 52C, the silicon emitter region 54E, and the silicon collector region 54C can be formed simultaneously, for example, by the ion implantation. The extrinsic base region 58 vertically contacts the silicon base region 54B, and has a doping of the first conductivity type.

In one embodiment, the germanium emitter region 52E and the germanium collector region 52C can have a same dopant concentration of dopants of the second conductivity type. The net dopant concentration of dopants of the second conductivity type, i.e., the concentration of the dopants of the second conductivity type less the concentration of dopants of the first conductivity type, in the germanium emitter region 52E and the germanium collector region 52C can be, for example, from $1.0 \times 10^{17}/cm^3$ to $3.0 \times 10^{21}/cm^3$, although lesser and greater dopant concentrations can also be employed. In another embodiment, a masking layer (not shown) can be employed to provide asymmetric net dopant concentration of dopants of the second conductivity type across the germanium emitter region 52E and the germanium collector region 52C, and across the silicon emitter region 54E and the silicon collector region 54C. As used herein, the type of doping in any semiconductor region is determined by the conductivity type of the net dopant concentration.

In one embodiment, the germanium emitter region 52E and the germanium collector region 52C can include implanted dopants of the second conductivity type at a same first atomic concentration after the ion implantation. In one embodiment, the silicon emitter region 54E and the silicon collector region 54C can include implanted dopants of the second conductivity type at a same second atomic concentration. In one embodiment, the first and second atomic concentrations can be substantially the same, and may differ only by the differences in the lattice constants and stopping power for implanted ions between silicon atoms and germanium atoms. In one embodiment, the thickness of the base cap 59 can be selected that the dopants of the second conductivity type are stopped within the base cap 59 during the ion implantation, and do not penetrate into the extrinsic base region 58.

If the ion implantation is performed along a surface normal of the silicon passivation layer 54L, the lateral offset of the boundary between the germanium base region 52B and the germanium emitter region 52E from the extrinsic base region 58 can be the same as the lateral offset of the boundary between the germanium base region 52B and the germanium collector region 52C from the extrinsic base region 58. In one embodiment, if the base cap 59 has the same stopping power as, or a greater stopping power than, the vertical stack of the doped silicon passivation layer (54E, 54B, 54C) and the doped germanium layer (52E, 52B, 52C) for ion implantation of dopants of the second conductivity type, the energy of the ion implantation can be selected that dopants of the second conductivity type reaches the bottommost region of the germanium emitter region 52E and the germanium collector region 52C, while not penetrating into the extrinsic base region 58.

The bottom surface of the dielectric spacer 70 is in contact with a peripheral portion of the top surface of the silicon emitter region 54E, a peripheral portion of the top surface of the silicon collector region 54C, and two disjoined peripheral portions of the top surface of the silicon base region 54B. The buried insulator layer 20 has a planar top surface that contacts the germanium base region 52B, the germanium emitter region 52E, and the germanium collector region 52C.

In one embodiment, the interface between the germanium emitter region 52E and the germanium base region 52B can be substantially vertically coincident with the interface between the silicon emitter region 54E and the silicon base region 54B after the ion implantation. Further, the interface between the germanium collector region 52C and the germanium base region 52B can be substantially vertically coincident with the interface between the silicon collector region 54C and the silicon base region 54B after the ion implantation.

In one embodiment, the entirety of the germanium layer (52E, 52B, 52C) can have the first thickness throughout, and the entirety of the silicon passivation layer (54E, 54B, 54C) can have the second thickness throughout. As discussed above, the first thickness can be at least twice the second thickness. The ratio of the first thickness to the second thickness can be kept such that the germanium bipolar junction transistor including the germanium emitter region 52E, the germanium base region 52B, and the germanium collector region 52C dominates the device characteristics of the bipolar junction transistor including the germanium bipolar junction transistor and a parasitic bipolar junction transistor including the silicon emitter region 54E, the silicon base region 54B, and the silicon collector region 54C.

The exemplary semiconductor structure thus includes a bipolar junction transistor (BJT), which includes a doped germanium layer (52E, 52B, 52C) in contact with an insulator layer (i.e., the buried insulator layer 20) and including the germanium base region 52B, the germanium emitter region 52E, and the germanium collector region 52C. The germanium base region 52B includes dopants of the first conductivity type. The germanium emitter region 52E is in contact with the germanium base region 52B and includes dopants of a second conductivity type that is the opposite type of the first conductivity type. The germanium collector region 52C is in contact with the germanium base region 52B and includes dopants of the second conductivity type. The BJT includes the silicon passivation layer (54E, 54B, 54C) that is in contact with the doped germanium layer (52E, 52B, 52C). The silicon passivation layer (54E, 54B, 54C) includes a silicon base region 54B, a silicon emitter region 54E, and a silicon collector region 54C. The silicon emitter region 54E is in contact with the silicon base region 54B. The silicon collector region 54C is in contact with the silicon base region 54B. The silicon base region 54B includes dopants of the first conductivity type and contacts the germanium base region 52B. The silicon emitter region 54E includes dopants of the second conductivity type and contacts the germanium emitter region 52E. The silicon collector region 54C includes dopants of the second conductivity type and contacts the germanium collector region 52C. The extrinsic base region 58 is in contact with the silicon base region 54B.

The silicon passivation layer (54E, 54B, 54C) can be polycrystalline. The top surfaces of the germanium base region 52B, the germanium emitter region 52E, and the germanium collector region 52C are coplanar among one another. In one embodiment, the top surfaces of the silicon base region 54B, the silicon emitter region 54E, and the silicon collector region 54C are coplanar among one another. The bottom surface of the dielectric spacer 70 is in contact with the top surfaces of the silicon base region 54B, the silicon emitter region 54E, and the silicon collector region 54C.

Figure 6:
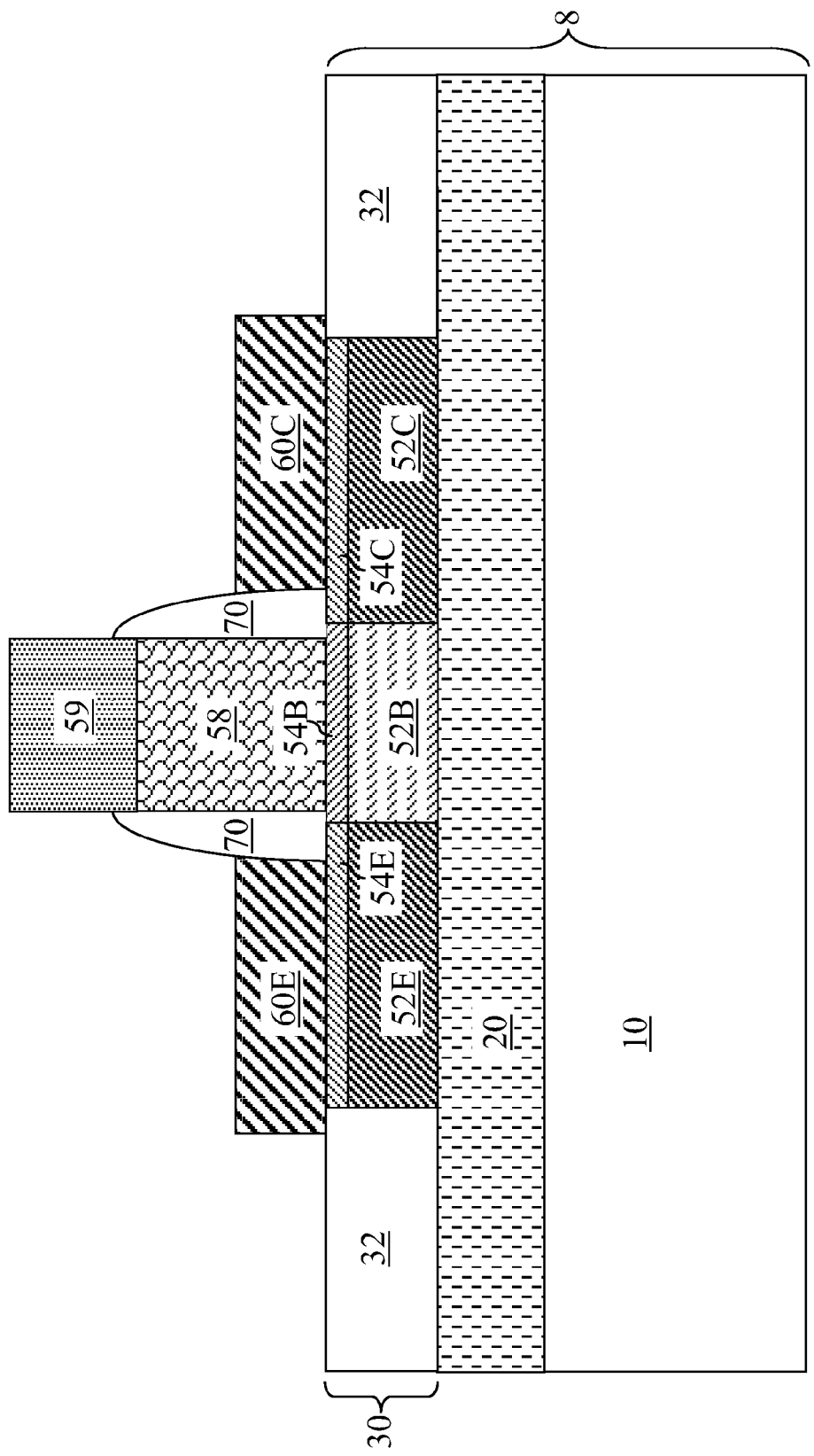
FIG. 6 is a vertical cross-sectional view of the exemplary semiconductor structure after selective deposition of an emitter contact region and a collector contact region according to an embodiment of the present disclosure.

Referring to FIG. 6, a semiconductor material can be optionally selectively deposited on the semiconductor surfaces of the silicon emitter region 54E and the silicon collector region 54C, while not growing from dielectric surfaces of the exemplary structure. The semiconductor material can be any polycrystalline semiconductor material known in the art. In one embodiment, the semiconductor material can be polycrystalline silicon.

The semiconductor material can be deposited employing a selective deposition process, in which the semiconductor material grows from semiconductor surfaces and does not grow from dielectric surfaces. An emitter contact region 60E having a doping of the second conductivity type is formed on the silicon emitter region 54E and an outer sidewall of the dielectric spacer 70. A collector contact region 60C having a doping of the second conductivity type is formed on the silicon collector region 54C and another outer sidewall of the dielectric spacer 70. The semiconductor material that grows on, and from, the silicon emitter region 54E constitutes the emitter contact region 60E, and the semiconductor material that grows on, and from, the silicon collector region 54C constitutes the collector contact region 60C. In other words, the semiconductor material is selectively deposited on the physically exposed surface of the silicon emitter region 54E and the physically exposed surface of the silicon collector region 54C, while the semiconductor material does not grow from surfaces of the dielectric spacer 70, the base cap 59, or the shallow trench isolation structure 32.

As the emitter contact region 60E grows with continued deposition of the semiconductor material during the selective deposition process, the emitter contact region 60E comes into contact with a lower portion of an outer sidewall of the dielectric spacer 70 and a peripheral top surface of the shallow trench isolation structure 32. Likewise, as the collector contact region 60C grows with continued deposition of the semiconductor material during the selective deposition process, the collector contact region 60C comes into contact with a lower portion of another outer sidewall of the dielectric spacer 70 and another peripheral top surface of the shallow trench isolation structure 32. The thickness of the emitter contact region 60E and the collector contact region 60C is less than the height of the dielectric spacer 70, and can be from 1 nm to 1,000 nm, although lesser and greater thicknesses can also be employed.

During the selective deposition process, at least one semiconductor precursor gas and at least one etchant gas are flowed into a process chamber to deposit the semiconductor material on physically exposed semiconductor surfaces of the silicon emitter region 54E and the silicon collector region 54C. The at least one semiconductor precursor gas and the at least one etchant gas can be any combination that enable selective deposition of the semiconductor material as known in the art. Non-limiting examples of the at least one semiconductor precursor gas include $SiH_4$, $SiH_2Cl_2$, $SiHCl_3$, $SiCl_4$, $Si_2H_6$, $GeH_4$, $Ge_2H_6$, and other precursor gases for depositing the selected semiconductor material. Non-limiting examples of the at least one etchant gas include HCl.

In one embodiment, the emitter contact region 60E and the collector contact region 60C can be doped in-situ during the selective deposition of the semiconductor material. Formation of the emitter contact region 60E and the collector contact region 60C with in-situ doping can be effected by flowing a dopant gas including a dopant atom of the second conductivity type concurrently with, or alternately with, the at least one semiconductor precursor gas and the at least one etchant gas. If the second conductivity type is n-type, the dopant gas can be, for example, $PH_3$, $AsH_3$, $SbH_3$, or a combination thereof. If the second conductivity type is p-type, the dopant gas can be, for example, $B_2H_6$. In this case, the emitter contact region 60E and the collector contact region 60C can be formed as doped polycrystalline semiconductor regions having a doping of the second conductivity type.

In another embodiment, the emitter contact region 60E and the collector contact region 60C can be deposited as intrinsic semiconductor material portions by selective deposition of an intrinsic semiconductor material, and can be subsequently doped by implanting dopants of the second conductivity type. Upon implantation of the dopants of the second conductivity type, the emitter contact region 60E has a doping of the second conductivity type and contacts the silicon emitter region 54E, and the collector contact region 60C has a doping of the second conductivity type and contacts the silicon collector region 54C.

The emitter contact region 60E and the collector contact region 60C can have a concentration of dopants of the second conductivity type, for example, from $1.0 \times 10^{19}/cm^3$ to $3.0 \times 10^{21}/cm^3$, although lesser and greater dopant concentrations can also be employed. In one embodiment, the concentration of dopants of the second conductivity type in the emitter contact region 60E and the collector contact region 60C can be greater than the net dopant concentration of dopants of the second conductivity type in the silicon emitter region 54E and the silicon collector region 54C.

In one embodiment, the semiconductor material in the emitter contact region 60E and the collector contact region 60C can have a smaller band gap than silicon. For example, the semiconductor material in the emitter contact region 60E and the collector contact region 60C can be a silicon germanium alloy or germanium. In this case, the contact resistance of the emitter contact region 60E and the collector contact region 60C can be reduced relative to a structure in which the emitter contact region 60E and the collector contact region 60C include silicon.

The semiconductor material deposited in the emitter contact region 60E is polycrystalline because the silicon emitter region 54E is polycrystalline, and the semiconductor material deposited in the collector contact region 60C is polycrystalline because the silicon collector region 54C is polycrystalline.

The dielectric spacer 70 is in contact with the silicon base region 54B, the silicon emitter region 54E that laterally contacts the silicon base region 54B, the emitter contact region 60E, the silicon collector region 54C that contacts the silicon base region 54B, and the collector contact region 60C. The bottom surfaces of the emitter contact region 60E and the collector contact region 60C can be coplanar with the bottom surface of the extrinsic base region 58. The emitter contact region 60E is vertically spaced from the doped germanium layer (52E, 52B, 52C) by the silicon emitter region 54E, and the collector contact region 60C is vertically spaced from the doped germanium layer (52E, 52B, 52C) by the silicon collector region 54C.

Figure 7:
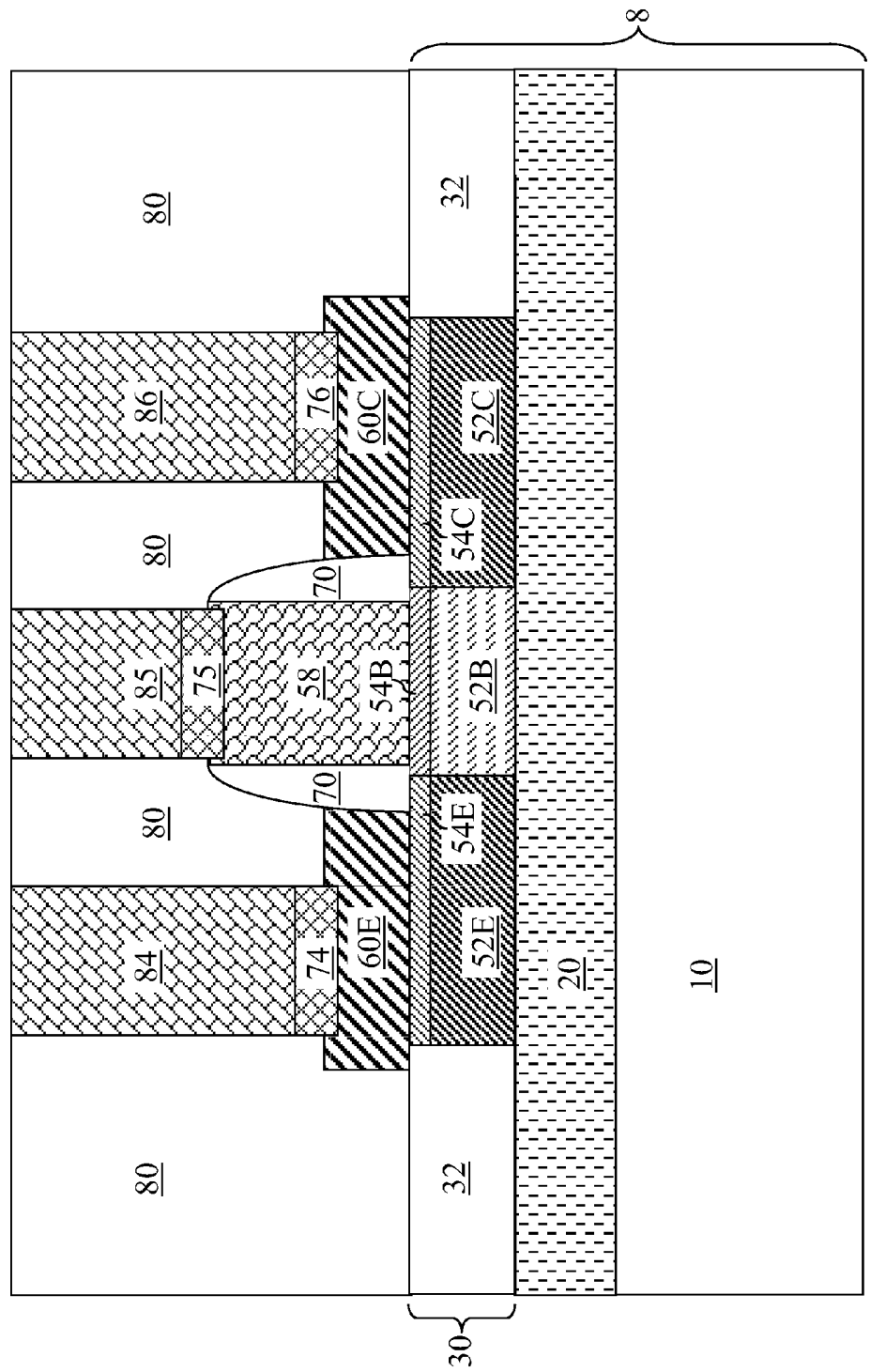
FIG. 7 is a vertical cross-sectional view of the exemplary semiconductor structure after formation of a contact-level dielectric layer, metal semiconductor alloy regions, and contact via structures according to an embodiment of the present disclosure.

Referring to FIG. 7, the base cap 59 can be removed, for example, by a wet etch. The chemistry of the wet etch can be selected such that the base cap 59 can be etched without etching the semiconductor materials of the emitter contact region 60E, the collector contact region 60C, and the extrinsic base region 58 or the dielectric materials of the shallow trench isolation structure 32 and the dielectric spacer 70. For example, if the base cap 59 includes silicon nitride, and the shallow trench isolation structure 32 and the dielectric spacer 70 include silicon oxide, a wet etch employing hot phosphoric acid can be employed to remove the base cap 59 selective to the semiconductor materials of the emitter contact region 60E, the collector contact region 60C, and the extrinsic base region 58 or the dielectric materials of the shallow trench isolation structure 32 and the dielectric spacer 70.

A contact-level dielectric layer 80 can be deposited over the extrinsic base cap 58, the dielectric spacer 70, the emitter contact region 60E, the collector contact region 60C, and the shallow trench isolation structure 32. The contact-level dielectric layer 80 can include undoped silicate glass (i.e., silicon oxide), doped silicate glass, organosilicate glass, or any other dielectric material known in the art that can be employed for forming interconnect structures. The contact-level dielectric layer 80 can be formed, for example, by chemical vapor deposition (CVD) and/or spin-coating. The top surface of the contact-level dielectric layer 80 can be planarized, for example, by chemical mechanical planarization (CMP).

Various contact via structures can be formed through the contact-level dielectric layer 80 to provide electrical contact to the germanium emitter region 52E, the germanium collector region 52C, and the germanium base region 52B through the stack of the silicon emitter region 54E and the emitter contact region 60E, through the stack of the silicon base region 54B and the extrinsic base region 58, and through the stack of the silicon collector region 54C and the collector contact region 60C, respectively. The various contact via structures can include for example, an emitter contact via structure 84 electrically connected to the emitter contact region 60E, a collector contact structure 86 electrically connected to the collector contact region 60C, and a base contact structure 85 electrically connected to the extrinsic base region 58. The various contact structures (84, 85, 86) can be formed, for example, by forming via trenches and filling the via trenches with at least one conductive material. The excess conductive material above the top surface of the contact-level dielectric layer 80 can be removed, for example, by chemical mechanical planarization.

Optionally, an emitter metal semiconductor alloy region 74, a collector metal semiconductor alloy region 76, and a base metal semiconductor alloy region 75 can be formed at the bottom of the via trenches by reacting a metal with physically exposed portions of the emitter contact region 60E, the collector contact region 60C, and the extrinsic base region 58, respectively.

Figure 8:
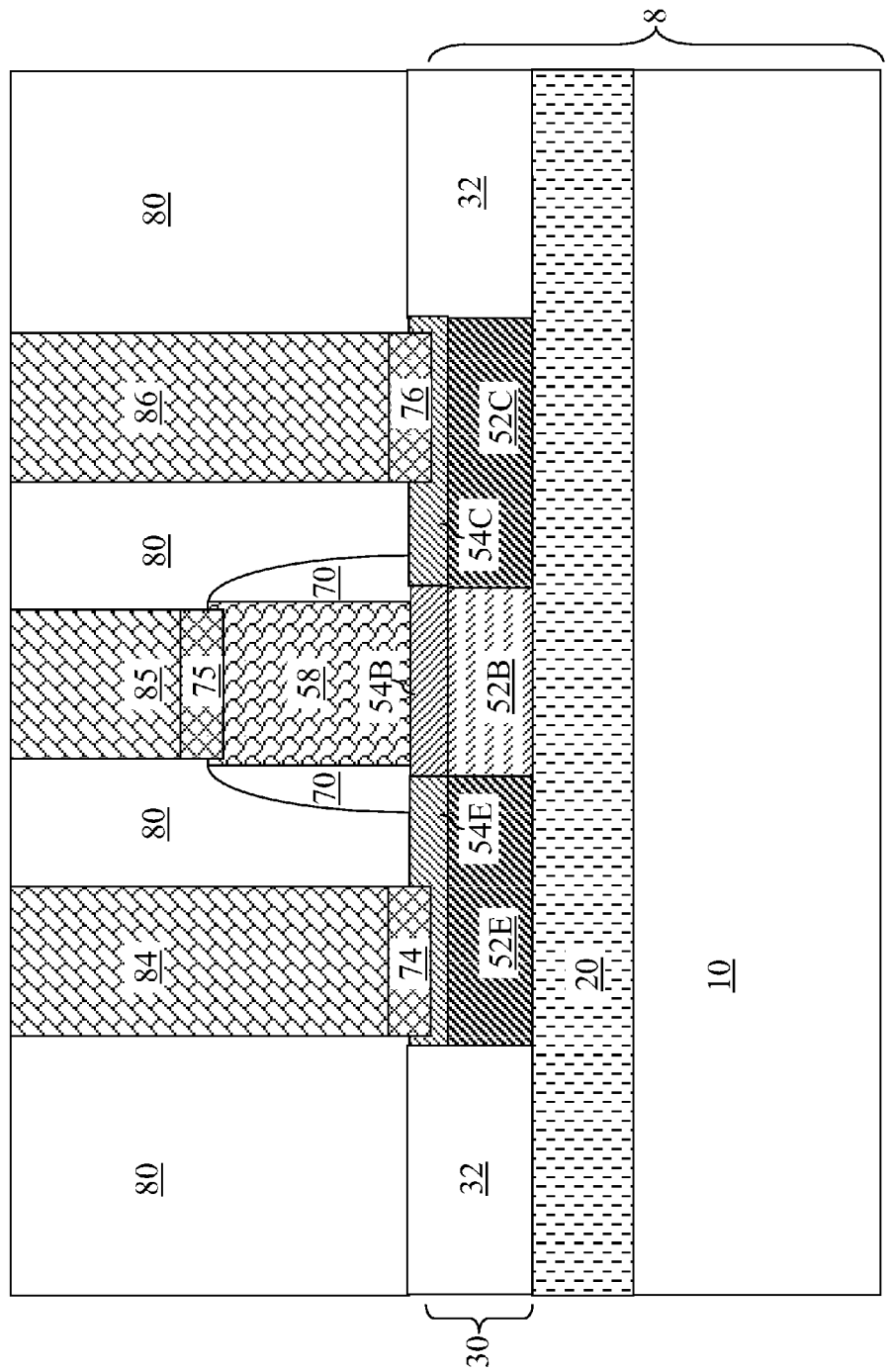
FIG. 8 is a vertical cross-sectional view of a variation of the exemplary semiconductor structure according to an embodiment of the present disclosure.

Referring to FIG. 8, a variation of the exemplary structure can be derived from the exemplary structure of FIG. 5 by omitting formation of the emitter contact region 60E (See FIG. 6) and the collector contact region 60C. An emitter metal semiconductor alloy region 74, a collector metal semiconductor alloy region 76, and a base metal semiconductor alloy region 72 can be formed at the bottom of the via trenches by reacting a metal with physically exposed portions of the silicon emitter region 54E, the silicon collector region 54C, and the extrinsic base region 58, respectively. In this case, the second thickness of the silicon passivation layer (54E, 54B, 54C) can be selected so as to prevent a physical contact between the emitter metal semiconductor alloy region 74 and the germanium emitter region 52E or between the collector metal semiconductor alloy region 76 and the germanium collector region 52C. For example, the second thickness can be greater than 15 nm.

Alternatively, the metal semiconductor alloy regions on the emitter contact region 60E, the collector contact region 60C, and the extrinsic base region 58 can be formed prior to deposition of the contact-level dielectric layer 80. This can be accomplished by depositing a metal on the semiconductor in the emitter contact region 60E, the collector contact region 60C, and the extrinsic base region 58, and subsequently reacting the metal with the respective underlying semiconductor material to form the various metal semiconductor alloy regions that extend across the entire upper and outer surfaces of the emitter contact region 60E, the collector contact region 60C, and the extrinsic base region 58. The unreacted metal portions are then selectively etched away, for example, by a wet etch.

The silicon passivation layer (54E, 54B, 54C) of the present disclosure prevents physical exposure of the germanium layer 52L prior to ion implantation of dopants of the second conductivity type, and physical exposure of the doped germanium layer (52E, 52B, 52C) after ion implantation of dopants of the second conductivity type. The silicon passivation layer (54E, 54B, 54C) is polycrystalline, and therefore, does not induce any strain on the doped germanium layer (54E, 54B, 54C).

The structure of the present disclosure includes a parasitic lateral bipolar junction transistor within the passivation silicon layer (54E, 54B, 54C). Since the bandgap of germanium is only 0.66 eV and the band gap of polysilicon is about 1.12 eV, the bipolar junction transistor including the doped germanium layer (52E, 52B, 52C) provides an electrical current many orders of magnitude larger than any electrical current from the parasitic lateral bipolar junction transistor within the passivation silicon layer (54E, 54B, 54C).

Further, the silicon emitter region 54E on the germanium emitter region 52E provides a wide band gap contact to the germanium emitter region 52E, i.e., an electrical contact to the germanium emitter region 52E provided by a semiconductor material having a greater band gap than the band gap of the germanium emitter region 52E. The wide band gap contact to the germanium emitter region 52E suppresses minority carrier current through the silicon emitter region 54E, and thus, increases the gain of the bipolar junction transistor including the doped germanium layer (52E, 52B, 52C).

In addition, the silicon base region 54B on the germanium base region 52B provides a wide band gap contact to the germanium base region 52B, i.e., an electrical contact to the germanium base region 52B provided by a semiconductor material having a greater band gap than the band gap of the germanium base region 52B. The wide band gap contact to the germanium base region 52B suppresses minority carrier current through the silicon base region 54B, and thus, increases the gain of the bipolar junction transistor including the doped germanium layer (52E, 52B, 52C).

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method of forming a semiconductor structure including a bipolar junction transistor (BJT), said method comprising:
    providing a substrate including a vertical stack of an insulator layer and a germanium layer having a doping of a first conductivity type;
    forming a silicon passivation layer on said germanium layer;
    forming an extrinsic base region on said silicon passivation layer; and
    forming regions having a doping of a second conductivity type that is the opposite of said first conductivity type in said germanium layer and in said silicon passivation layer by ion implantation of dopants of said second conductivity type, wherein a germanium emitter region and a germanium collector region are formed in said germanium layer, and a silicon emitter region and a silicon collector region are formed in said silicon passivation layer.

2. The method of claim 1, wherein a portion of said germanium layer not implanted by said dopants of said second conductivity type constitutes a germanium base region, and a portion of said silicon passivation layer not implanted by said dopants of said second conductivity type constitutes a silicon base region.

3. The method of claim 1, wherein said germanium emitter region and said germanium collector region include implanted dopants of said second conductivity type at a same first atomic concentration after said ion implantation.

4. The method of claim 3, wherein said silicon emitter region and said silicon collector region include implanted dopants of said second conductivity type at a same second atomic concentration.

5. The method of claim 4, wherein an interface between said germanium emitter region and said germanium base region is vertically substantially coincident with an interface between said silicon emitter region and said silicon base region after said ion implantation.

6. The method of claim 5, wherein an interface between said germanium collector region and said germanium base region is vertically substantially coincident with an interface between said silicon collector region and said silicon base region after said ion implantation.

7. The method of claim 1, wherein an entirety of said germanium layer has a first thickness throughout, and an entirety of said silicon passivation layer has a second thickness throughout.

8. The method of claim 7, wherein said first thickness is at least twice said second thickness.

9. The method of claim 1, wherein said silicon passivation layer is formed as a polycrystalline silicon layer.

10. The method of claim 1, further comprising:
    forming an emitter contact region having a doping of said second conductivity type on said silicon emitter region; and
    forming a collector contact region having a doping of said second conductivity type on said silicon collector region.

11. The method of claim 10, wherein said emitter contact region and said collector contact region are formed by selective deposition of a semiconductor material in which said semiconductor material is deposited on semiconductor surfaces, and does not grow from dielectric surfaces.

12. The method of claim 10, further comprising:
    forming an emitter metal semiconductor alloy region on said emitter contact region; and
    forming a collector metal semiconductor alloy region on said collector contact region.

13. The method of claim 10, wherein said emitter contact region and said collector contact region are formed as doped polycrystalline semiconductor regions having a doping of said second conductivity type.

14. The method of claim 1, wherein said forming of said extrinsic base region comprises:
    depositing an extrinsic base layer over said semiconductor passivation layer; and
    patterning said extrinsic base layer to form said extrinsic base region.

15. The method of claim 14, further comprising forming a dielectric spacer around sidewalls of said extrinsic base region.

16. The method of claim 15, further comprising:
- forming an emitter contact region having a doping of said second conductivity type on said silicon emitter region and an outer sidewall of said dielectric spacer; and
- forming a collector contact region having a doping of said second conductivity type on said silicon collector region and another outer sidewall of said dielectric spacer.

17. The method of claim 15, wherein said forming of said dielectric spacer comprises:
- depositing a dielectric material layer on sidewalls of said extrinsic base region and on physically exposed top surfaces of said silicon passivation layer; and
- removing horizontal portions of said dielectric material layer by an anisotropic etch, wherein a remaining portion of said dielectric material layer is said dielectric spacer.

18. The method of claim 1, further comprising forming a shallow trench isolation structure laterally surrounding a portion of a vertical stack of said germanium layer and said silicon passivation layer.

19. The method of claim 1, wherein said germanium layer is a single crystalline germanium layer.

20. The method of claim 1, wherein said substrate comprises a handle substrate that contacts a planar bottom surface of said insulator layer.

\* \* \* \* \*